United States Patent [19]

Yanagi et al.

[11] Patent Number: 4,552,092
[45] Date of Patent: Nov. 12, 1985

[54] VACUUM VAPOR DEPOSITION SYSTEM

[75] Inventors: Kenichi Yanagi; Toshio Taguchi; Tetsuyoshi Wada; Heisaburo Furukawa; Kanji Wake, all of Hiroshima, Japan

[73] Assignees: Mitsubishi Jukogyo Kabushiki Kaisha; Nisshin Steel Co., Ltd., both of Tokyo, Japan

[21] Appl. No.: 652,676

[22] Filed: Sep. 19, 1984

[51] Int. Cl.$^4$ .............................................. C23C 13/10
[52] U.S. Cl. .................................... 118/718; 118/725; 118/726; 118/730
[58] Field of Search ............... 118/726, 725, 724, 718, 118/715, 729, 730; 427/251

[56] References Cited

U.S. PATENT DOCUMENTS

| | | | |
|---|---|---|---|
| 2,793,609 | 5/1957 | Shen et al. | 118/726 |
| 2,925,062 | 2/1960 | Schwidt | 118/718 |
| 3,176,356 | 4/1965 | Jenkin | 427/251 X |
| 3,198,167 | 8/1965 | Bakish | 118/718 |
| 3,460,976 | 8/1966 | Allen | 118/718 X |
| 3,488,617 | 1/1970 | Dietrich et al. | 118/718 X |

FOREIGN PATENT DOCUMENTS 1359505  3/1964  France ................................ 118/725

Primary Examiner—John D. Smith
Assistant Examiner—Bernard F. Plantz
Attorney, Agent, or Firm—Wenderoth, Lind & Ponack

[57] ABSTRACT

A vacuum vapor deposition system including a high-vacuum vapor deposition chamber provided with a rotary cell around which band steel is wound as it is passed through the chamber. A crucible for molten metal has a hood for guiding vapor of said metal to a vapor deposition port opposed to the rotary cell, and arcuate covers connected to the hood at the entrance and exit positions of the band steel. The vapor deposition port is spaced slightly from the rotary cell so that the covers will not come into contact with the band steel. A heater is provided for heating the surface of the rotary cell up to a temperature equal to or higher than a reevaporation temperature of the metal under a vapor pressure of the vapor of the metal in the proximity of the rotary cell so that the metal will not be deposited onto the opposite end portions of the rotary cell which are not covered by the band steel. A heater is also provided for heating the surfaces of the hood and the covers up to a temperature equal to or higher than such reevaporation temperature of the metal so that metal will not be deposited onto the hood and the covers.

1 Claim, 3 Drawing Figures

VACUUM VAPOR DEPOSITION SYSTEM

The present invention relates to a vacuum vapor deposition system for vapor-depositing metal onto band steel, and more particularly to improvements in such vacuum vapor deposition system such that surplus metal vapor which is not used for vapor deposition onto the band steel may not be produced.

Figure 1:
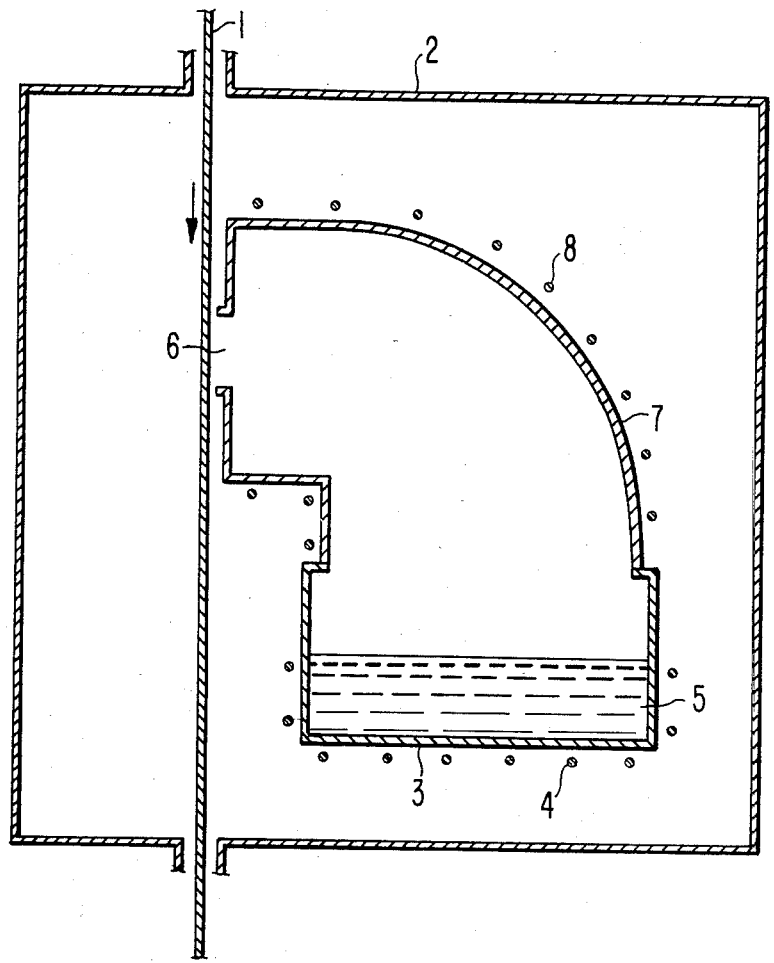

Heretofore, a vacuum vapor deposition system for vapor-depositing metal onto band steel as shown in FIG. 1, has been known. In FIG. 1, reference numeral 1 designates band steel, numeral 2 designates a vacuum envelope, numeral 3 designates a crucible for melting metal and holding molten metal 5, numeral 4 designates a heater for heating the crucible 3, numeral 7 designates a hood for guiding metal vapor evaporated from the molten metal 5 to a vapor deposition port, and numeral 8 designates a heater for heating the hood 7. However, the vacuum vapor deposition system having such structure had a shortcoming that metal vapor would surplusly spurt out through the vapor deposition port 6, resulting in deposition of the metal onto the surface of the band steel 1 on the side which is not to be subjected to vapor deposition, or resulting in deposition of the metal onto the inner wall surface of the vacuum envelope.

On the other hand, with regard to the technique of vapor-depositing metal onto a base sheet made of paper or plastics, a procedure has been proposed, in which a base sheet is wound around a roll which is rotating at a circumferential velocity equal to a traveling velocity of the base sheet and metal is vapor-deposited onto one side of the base sheet opposite to the side making contact with the roll.

Figure 2:
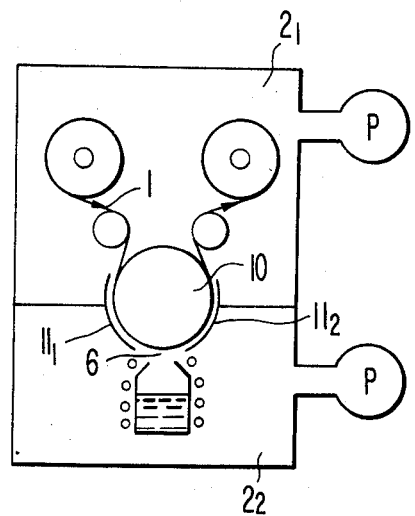

According to the proposed procedure, as shown in FIG. 2, arcuate covers $11_1$ and $11_2$ are disposed along a surface of a roll 10 on an entrance side and an exit side, respectively, of a base sheet 1 with a vapor deposition port 6 placed therebetween so as to form a slight clearance for avoiding contact between the roll surface and the covers, the covers $11_1$ and $11_2$ are fixedly secured to side walls of a vacuum chamber in such manner that the vacuum chamber may be divided into two vacuum chambers $2_1$ and $2_2$ with the roll 10 placed therebetween, the base sheet 1 is supplied from one vacuum chamber (low-vacuum chamber) $2_1$ and is led to the other vacuum chamber, that is, a vapor deposition chamber (high-vacuum chamber) $2_2$ while being wound around the roll 10, and after vapor deposition the base sheet 1 is again returned to the low-vacuum chamber $2_1$. In this procedure, since a large resistance is acted upon a gas when the gas moves through the clearance between the roll 10 and the covers $11_1$ and $11_2$, there is an advantage that metal vapor within the high-vacuum vapor deposition chamber $2_2$ is prevented from moving into the low-vacuum chamber $2_1$ and also deposition of metal onto the surface of the base sheet 1 on the side which is not to be subjected to vapor deposition can be precluded. However, since the covers $11_1$ and $11_2$ are at a lower temperature than the metal vapor, there is a shortcoming that metal would be deposited onto the surfaces of the covers $11_1$ and $11_2$ faced to the roll 10, and so, the procedure is not suitable for long-period operation.

The inventors of this invention have repeated researches so as to obviate the shortcoming of the system shown in FIG. 1 by applying the above-described vapor deposition technique to the vapor deposition system for band steel shown in FIG. 1 while eliminating the above-described shortcomings of the prior art, and as a result, it has become apparent that since the band steel traveling as wound around a roll would move in the lengthwise direction of the roll towards a drive side or towards the opposite side during its traveling, the arcuate covers must be provided so as to have a vapor deposition port that is somewhat broader than the width of the band steel. However, if such provision is made, a new problem is encountered that surplus metal vapor would be deposited onto the surface portion of the roll around which the band steel is not wound.

It is therefore one object of the present invention to provide a vacuum vapor deposition system in which all the above-mentioned shortcomings and problems are eliminated and resolved and vacuum vapor deposition onto band steel can be performed efficiently.

According to one feature of the present invention, there is provided a vacuum vapor deposition system including a high-vacuum vapor deposition chamber provided with a rotary cell around which band steel is wound as it is passed through the chamber, a crucible for melting metal, a hood connected to the crucible for guiding vapor of the metal, a vapor deposition port of which is opposed to the rotary cell, and arcuate covers connected to the hood on a band steel entrance side and on a band steel exit side, respectively, of the vapor deposition port as spaced slightly from the rotary cell so that the covers may not come into contact with the band steel wound around the rotary cell, which vacuum vapor deposition system comprises means for heating the surface of the rotary cell up to a temperature equal to or higher than a reevaporation temperature of the metal under a vapor pressure of the vapor of the metal in the proximity of the rotary cell so that the metal may not be deposited onto the opposite end portions of the rotary cell around which the band steel is not wound, and means for heating the surfaces of the hood and the covers up to a temperature equal to or higher than a reevaporation temperature of the metal under a vapor pressure of the vapor of the metal in the proximity of the hood and the covers so that the metal may not be deposited onto the hood and the covers.

Figure 3:
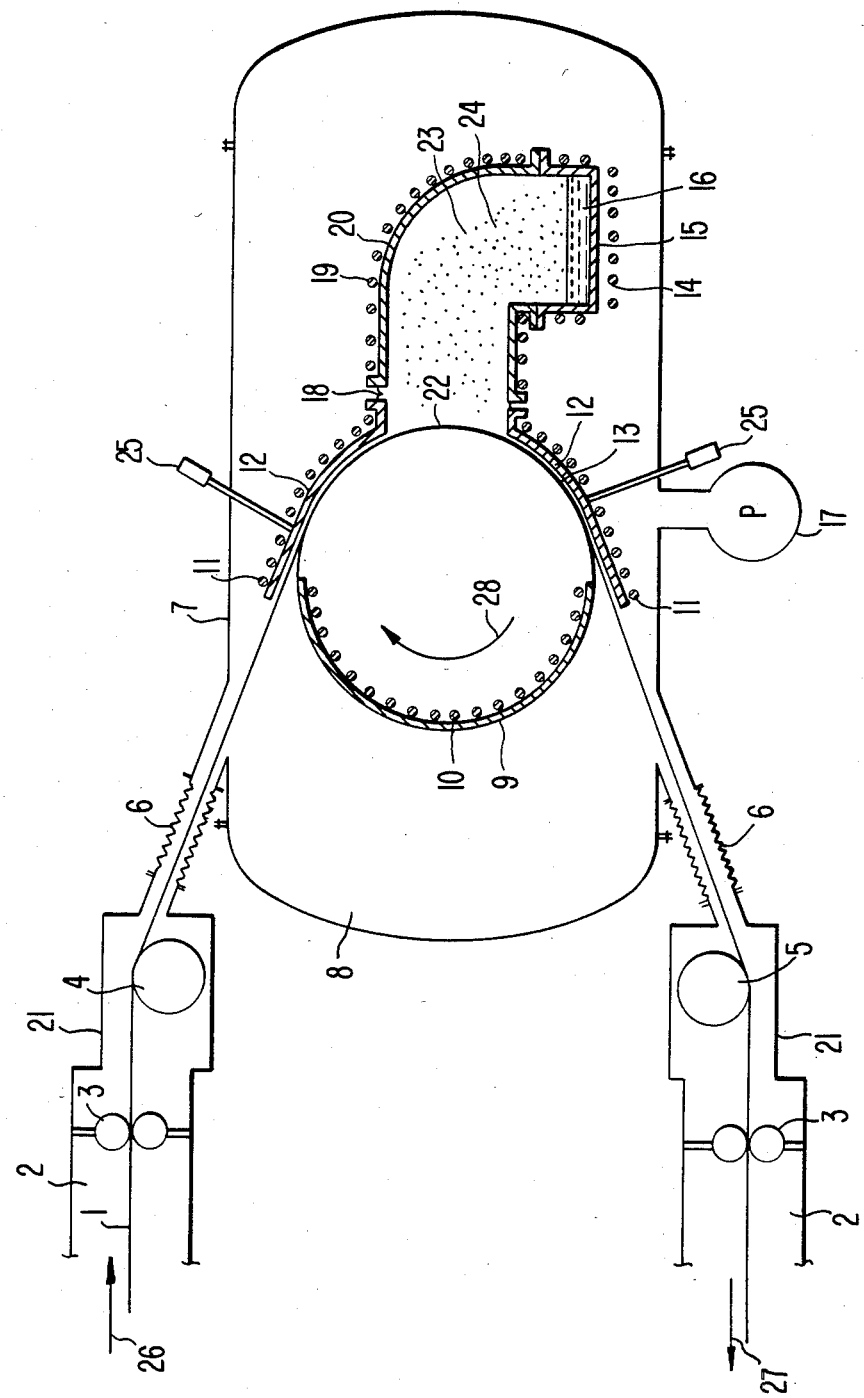

The above-mentioned and other features and objects of the present invention will become more apparent by reference to the following description of one preferred embodiment of the invention taken in conjunction with the accompanying drawings, wherein:

FIG. 1 is a schematic cross-section view showing a vacuum vapor deposition system for vapor-depositing metal onto band steel in the prior art, FIG. 2 is a schematic cross-section view showing a vacuum vapor deposition system for vapor-depositing metal onto a sheet of paper or plastics in the prior art, and FIG. 3 is a schematic cross-section view showing one preferred embodiment of a vacuum vapor deposition system according to the present invention.

Referring now to FIG. 3, reference numeral 1 designates band steel, numeral 2 designates a vacuum seal chamber connected to a vacuum vapor deposition chamber 7 and held at a higher pressure than the vapor deposition chamber 7, numeral 3 designates vacuum sealing devices, numerals 4 and 5 designate guide rolls for making the band steel 1 enter into and exit from the vacuum vapor deposition chamber 7, numeral 6 designates expansible and contractible bellows for connecting roll chambers 21 with the vacuum vapor deposition chamber 7, numeral 9 designates a rotary cell to be used for winding the band steel 1 therearound and vapor-depositing metal onto the band steel 1, numeral 10 designates a heater for heating the rotary cell 9, numeral 12 designates covers on the entrance side and on the exit side of the band steel 1, which are mounted in the proximity of the rotary cell 9 with a slight clearance 13 spaced from the rotary cell 9, numeral 11 designates a heater for heating the covers 12, numeral 15 designates a crucible for melting metal and holding the molten metal 16, numeral 14 designates a heater for heating the crucible, numeral 20 designates a hood for guiding evaporated metal vapor 23 to a vapor deposition port 22, numeral 18 designates expansible and contractible bellows provided between the covers 12 and the hood 20 in order to arbitrarily adjust the clearances 13 depending upon a thickness of the band steel 1, numeral 19 designates a heater for heating the hood 20, numeral 17 designates a vacuum pump for evacuating the vacuum vapor deposition chamber 7, numeral 25 designates driving devices for moving the covers 12 to adjust the clearances 13, arrows 26 and 27 indicate the direction of entrance and the direction of exit of the band steel 1, and arrow 28 indicates the direction of rotation of the rotary cell 9.

The vacuum vapor deposition system according to the present invention constructed as described above can operate advantageously in the following manner.

In the crucible 15, metal to be vapor-deposited is heated and molten by the heater 14, and the molten metal 16 is maintained at a temperature within a predetermined temperature range, for instance, in the case where the molten metal 16 is zinc, it is maintained at about 430°-550° C.

A gas within the vacuum vapor deposition chamber 7 is exhausted by the vacuum pump 17, and thereby the interior 8 of the chamber 7 is evacuated up to a vacuum pressure of $1-10^{-4}$ Torr. At this moment, the interior 24 of the hood 20 is also evacuated through the slight clearances 13 between the rotary cell 9 and the covers 12 up to the same vacuum pressure of $1-10^{-4}$ Torr as the interior 8 of the vacuum vapor deposition chamber 7.

The clearances 13 are adjusted to a minimum gap distance larger than the thickness of the band steel 1 such that when the band steel 1 moves as wound around the rotary cell 9, the band steel 1 may not come into contact with the covers 12. In addition, since the band steel 1 is continuously passed through the vacuum vapor deposition system, the clearances 13 are adjusted in such manner that even when a joint portion between consecutive band steel sheets passes along the covers 12, also the joint portion may not come into contact with the covers 12.

Furthermore, the clearance 13 also serves to prevent the metal vapor 23 within the hood 20 from moving into the vacuum vapor deposition chamber 7, if the gap distance of the clearance 13 is small, then at a vacuum pressure of about $1-10^{-4}$ Torr a flow of a gas changes from a general gas flow within the atmosphere, that is, a viscous flow to a molecular flow, and in order to make this molecular flow hard to flow it is effective to increase the length of the clearance 13 (that is, the length of the cover 12) simultaneously with reduction of the gap distance of the clearance 13. Especially, since the molecular flow becomes hard to flow in proportion to the length of the clearance 13, the length of the clearance 13 (that is, the length of the cover 12) is preliminarily designed to be long, and then the gap distance of the clearance 13 is adjusted while taking into consideration the above-described contact between the band steel 1 and the cover 12.

The adjustment of the clearances 13 is effected in the following manner. That is, the clearances 13 are preliminarily set to have a large gap distance by means of the hydraulically or electrically operable driving devices 25 for the covers 12, and after the interior 24 of the hood 20 has reached a predetermined vacuum pressure, the driving devices 25 are actuated so as to realize desired slight clearances 13. During these operations, when the interior 24 of the hood 20 has reached the predetermined vacuum pressure, the molten metal 16 begins to evaporate and the interior 24 is filled with the metal vapor 23. Just before filling of the metal vapor 23, the clearances 13 have been adjusted to a desired gap distance.

As the clearance 13 is formed so as to have an increased flow resistance against a gas flowing therethrough as described above, the metal vapor 23 would not leak out from the interior 24 of the hood 20 into the internal space 8 of the vacuum evaporation chamber 7, hence the vacuum vapor deposition chamber 7 would not be contaminated by surplus metal vapor, the operations of opening the vacuum vapor deposition chamber to the atmosphere and periodically removing solidified metal deposited onto its inner wall surface as is the case with the vacuum vapor deposition system in the prior art, are quite unnecessary, and a working efficiency of the vapor deposition plating work is greatly enhanced.

In addition, during the above-described operations, the hood 20 is heated by the heater 19 and the covers 12 are heated by the heater 11 up to a temperature at which metal cannot be vapor-deposited from the metal vapor 23 onto these members, that is, up to a temperature equal to or higher than a reevaporation temperature of the metal of the metal vapor 23 under the vapor pressure of the metal vapor 23 in the proximity of the hood 20 and the covers 12, for instance, in the case where the metal of the metal vapor 23 is zinc, up to a temperature of 230°-580° C. under the above-described vacuum pressure of $1-10^{-4}$ Torr. Thereby, the metal of the metal vapor 23 would not be deposited onto the hood 20 and the covers 12, hence the hood 20 and the covers 12 would not be contaminated, and the interior 24 of the hood 20 as well as the clearances 13 can be maintained in a clean condition over a long period of time.

Furthermore, the rotary cell 9 is also heated by the heater 10 up to a temperature at which the metal of the metal vapor 23 cannot be deposited thereon, that is, up to a temperature equal to or higher than a reevaporation temperature of the metal of the metal vapor 23 under the vapor pressure of the metal vapor 23 in the proximity of the rotary cell 9, for instance, in the case where the metal vapor 23 is zinc vapor, up to 230°-580° C. under the vacuum pressure of $1-10^{-4}$ Torr, thereby deposition of the metal of the metal vapor 23 onto the surface of the rotary cell 9 can be prevented, and the surface of the rotary cell 9 can be maintained in a clean condition over a long continuous period of time.

In the above-described embodiment, it is essentially necessary to control the atmosphere within the vacuum vapor deposition chamber 7 so as to be maintained at the above-described vacuum pressure of $1-10^{-4}$ Torr. This is because so long as the vacuum pressure is maintained in this specific range, the band steel 1 would not receive heat from the rotary cell 9 heated up to the above-described temperature and accordingly the metal once vapor-deposited onto the band steel 1 would not reevaporate. For instance, in the case of zinc vapor, within an atmosphere at a vacuum pressure of $10^{-2}$ Torr, if the temperature of the band steel 1 becomes 340° C. or higher, then reevaporation is observed remarkably. However, within a high-vacuum atmosphere at the above-described vacuum pressure of 1 Torr or lower, a thermal conductivity between the band steel 1 and the rotary cell 9 is extremely small, and so, the band steel 1 would not be heated up to a temperature higher than the above-mentioned temperature when the band steel 1 is passed through the vacuum vapor deposition system while being wound around the heated rotary cell 9.

While description has been made above on the construction and operation of the vacuum vapor deposition system according to the present invention which is to be used in the case of vapor-depositing metal onto one surface of band steel, the system illustrated in FIG. 3 can be modified so as to be able to vapor-deposit metal onto the both surfaces of the band steel 1 by additionally providing another set of component parts designated by reference numerals 10–20 and 22–25 in FIG. 5. In this modified case, either the both surfaces of the band steel 1 can be vapor-deposited with the same amount of metal, or the so-called differential thickness plating, in which the amounts of vapor-deposited metal are made different between one surface and the other surface of the band steel 1, can be easily performed by adjusting the electric powers of the heaters 14 for the crucibles 15 in the respective sets of the component parts.

As described in detail above, the vacuum vapor deposition system according to the present invention can perform vapor deposition plating on the band steel 1 in an excellent manner without leaking surplus metal vapor into the vacuum vapor deposition chamber 7 nor depositing surplus metal onto the hood 20 and the covers 12, hence the troublesome maintenance and management that solidified metal deposited over the entire inner wall surface of the vacuum vapor deposition chamber must be periodically removed by opening the chamber as is the case with the prior art system, are quite unnecessary, and so, the working efficiency of the vacuum vapor deposition system can be greatly enhanced.

Since many changes and modifications can be made to the above-described construction without departing from the spirit of the present invention, it is intended that all matter contained in the above description and illustrated in the accompanying drawings shall be interpreted to be illustrative and not as a limitation to the scope of the invention.

What is claimed is:

1. A vacuum vapor deposition system including a high-vacuum vapor deposition chamber provided with a rotary cell around which band steel is wound as it is passed through the chamber, a crucible for melting metal, a hood connected to said crucible for guiding vapor of said metal, a vapor deposition port of which is opposed to said rotary cell, and arcuate covers connected to said hood on a band steel entrance side and on a band steel exit side, respectively, of said vapor deposition port as spaced slightly from said rotary cell so that the covers may not come into contact with the band steel wound around said rotary cell; Characterized in that said system comprises means for heating the surface of said rotary cell up to a temperature equal to or higher than a reevaporation temperature of said metal under a vapor pressure of the vapor of said metal in the proximity of said rotary cell so that said metal may not be deposited onto the opposite end portions of said rotary cell around which said band steel is not wound, and means for heating the surfaces of said hood and said covers up to a temperature equal to or higher than a reevaporation temperature of said metal under a vapor pressure of the vapor of said metal in the proximity of said hood and said covers so that said metal may not be deposited onto said hood and said covers.

* * * * *